(12) United States Patent
Mouri et al.

(10) Patent No.: US 10,665,478 B2
(45) Date of Patent: May 26, 2020

(54) LIQUID PROCESSING APPARATUS

(71) Applicant: Tokyo Electron Limited, Tokyo (JP)

(72) Inventors: Nobuhiko Mouri, Koshi (JP); Shingo Kamitomo, Koshi (JP); Masakazu Yarimitsu, Koshi (JP); Takeru Hirose, Koshi (JP); Tomohito Ura, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 535 days.

(21) Appl. No.: 15/454,108

(22) Filed: Mar. 9, 2017

(65) Prior Publication Data
US 2017/0278727 A1    Sep. 28, 2017

(30) Foreign Application Priority Data

Mar. 28, 2016 (JP) .................. 2016-063210

(51) Int. Cl.
*H01L 21/304* (2006.01)
*H01L 21/67* (2006.01)
*B08B 1/00* (2006.01)
*B08B 17/00* (2006.01)
*H01L 21/687* (2006.01)

(52) U.S. Cl.
CPC ........ *H01L 21/67046* (2013.01); *B08B 1/002* (2013.01); *B08B 17/00* (2013.01); *H01L 21/67051* (2013.01); *H01L 21/68735* (2013.01)

(58) Field of Classification Search
None
See application file for complete search history.

(56) References Cited

FOREIGN PATENT DOCUMENTS

JP    2010-093190 A  *  4/2010
JP    2010-093190 A     4/2010

* cited by examiner

*Primary Examiner* — Michael E Barr
*Assistant Examiner* — Jason P Riggleman
(74) *Attorney, Agent, or Firm* — Pearne & Gordon LLP

(57) ABSTRACT

A liquid residue on a bottom surface of a substrate can be reduced while placing the substrate accurately. A liquid processing apparatus includes an inclined portion, a plurality of supporting members, a processing liquid supply unit and a rotation unit. The inclined portion is provided under the substrate, and has an inclined surface which is inclined downwards from an outer side of the substrate toward an inner side thereof and is extended along a circumferential direction of the substrate. The supporting members are protruded from the inclined surface and configured to support the substrate from below. The processing liquid supply unit is configured to supply a processing liquid onto a top surface of the substrate. The rotation unit is configured to rotate the inclined portion. Further, each of the supporting members has a long narrow shape extended from the outer side of the substrate toward the inner side thereof.

12 Claims, 12 Drawing Sheets

LIQUID PROCESSING APPARATUS

CROSS-REFERENCE TO RELATED APPLICATION

This application claims the benefit of Japanese Patent Application No. 2016-063210 filed on Mar. 28, 2016, the entire disclosures of which are incorporated herein by reference.

TECHNICAL FIELD

The embodiments described herein pertain generally to a liquid processing apparatus.

BACKGROUND

Conventionally, as a liquid processing apparatus which performs a liquid processing on a substrate such as a semiconductor wafer or a glass substrate, there is known a single-wafer type liquid processing apparatus. The single-wafer type liquid processing apparatus includes, for example, a substrate holding unit configured to rotate the substrate while holding an outer peripheral portion of the substrate; and a supply unit configured to supply a processing liquid onto a top surface of the substrate held by the substrate holding unit.

In this liquid processing apparatus, it is required to suppress the processing liquid supplied onto the top surface of the substrate from flowing onto a bottom surface of the substrate. In this regard, recently, there is proposed a liquid processing apparatus in which the substrate is held on an inclined surface which is extended along the circumference of the substrate and the bottom surface of the substrate and the inclined surface are in contact with each other along the substantially entire circumference of the substrate. With this configuration, the processing liquid can be suppressed from flowing from the top surface of the substrate onto the bottom surface thereof.

If, however, the substrate is bent, a minute gap may be formed between the substrate and the inclined surface, and the processing liquid may flow toward the bottom side of the substrate through this minute gap. As a result, in the above liquid processing apparatus, a liquid residue may be generated at a peripheral portion of the bottom surface of the processed substrate.

Meanwhile, Patent Document 1 describes a liquid processing apparatus in which spherical supporting members are provided on the inclined surface and the substrate is supported by these supporting members. To elaborate, the spherical supporting members are arranged to support positions of the bottom surface of the substrate distanced 1 mm to 2 mm away from an outer edge of the substrate toward a center thereof.

Patent Document 1: Japanese Patent Laid-open Publication No. 2010-093190

In the structure described in Patent Document 1, however, when performing a liquid processing on the substrate with a pattern forming surface thereof facing downwards (that is, the pattern forming surface serves as the bottom surface), it may be difficult to place the substrate accurately, and interference between the supporting members and the pattern forming surface may occur.

SUMMARY

In view of the foregoing, exemplary embodiments provide a liquid processing apparatus capable of reducing a liquid residue on a bottom surface of a substrate while placing the substrate accurately.

In an exemplary embodiment, there is provided a liquid processing apparatus including an inclined portion, a plurality of supporting members, a processing liquid supply unit and a rotation unit. The inclined portion is provided under a substrate and has an inclined surface which is inclined downwards from an outer side of the substrate toward an inner side thereof and is extended along a circumferential direction of the substrate. The supporting members are protruded from the inclined surface and configured to support the substrate from below. The processing liquid supply unit is configured to supply a processing liquid onto a top surface of the substrate supported by the supporting members. The rotation unit is configured to rotate the inclined portion. Further, each of the supporting members has a long narrow shape extended from the outer side of the substrate toward the inner side thereof.

According to the exemplary embodiment, it is possible to reduce a liquid residue on a bottom surface of a substrate while placing the substrate accurately.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
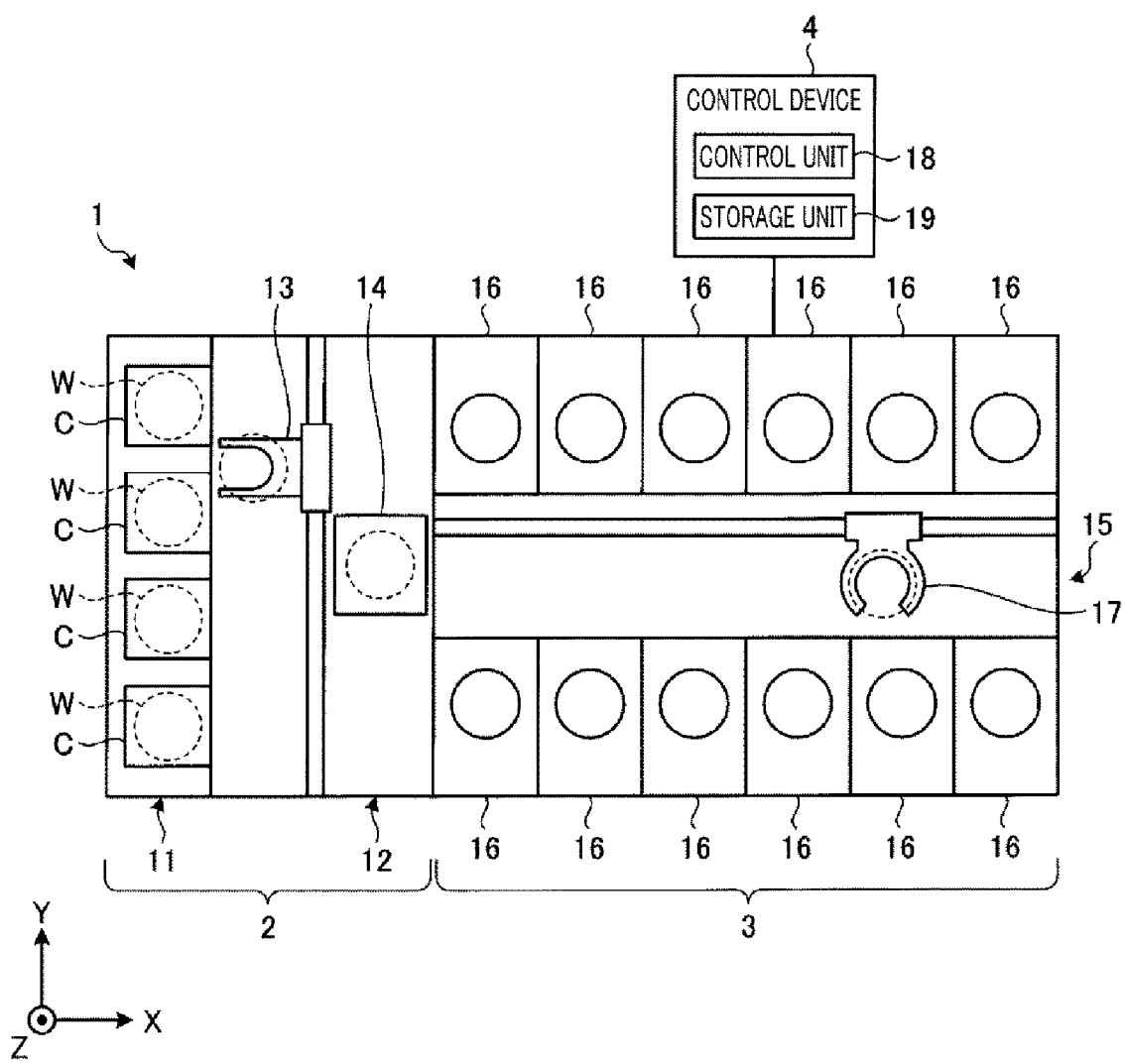
FIG. 1 is a diagram illustrating an outline of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, example embodiments of a liquid processing apparatus will be explained in detail with reference to the accompanying drawings. Further, the present disclosure is not limited to the following example embodiments.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the substrate processing system 1. The control unit 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Configuration of the Processing Unit

Figure 2:
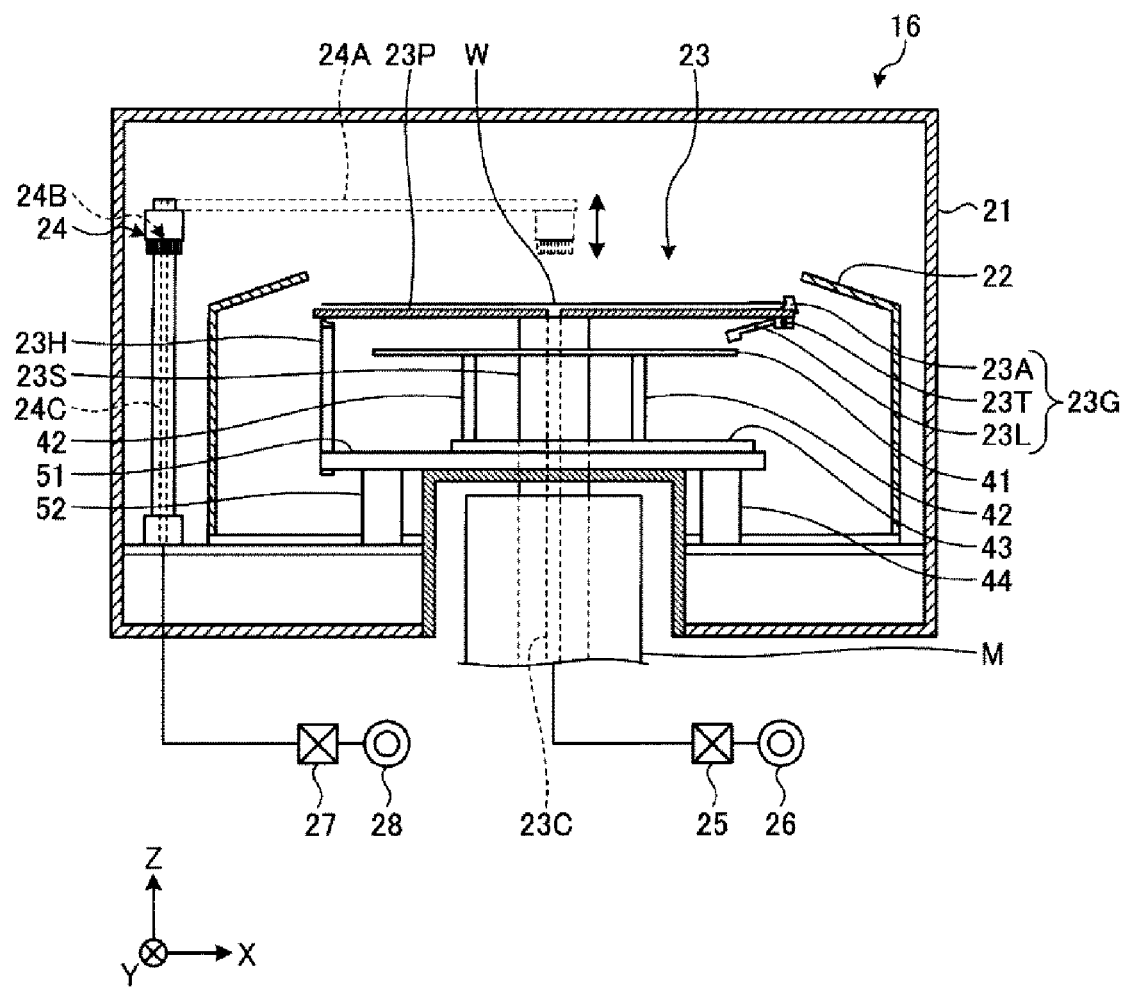
FIG. 2 is a diagram for describing a configuration of a processing unit.

Now, a configuration of the processing unit 16 will be elaborated with reference to FIG. 2. FIG. 2 is a diagram for describing the configuration of the processing unit 16.

As depicted in FIG. 2, the processing unit 16 includes a substantially hexahedral housing 21; a substantially cylindrical cup 22 which is provided at a substantially central portion within the housing 21 and has an open top; a wafer holding/rotating unit 23 provided within the cup 22 and configured to hold and rotate the wafer W; and a brush 24 configured to supply a processing liquid onto the wafer W held by the wafer holding/rotating unit 23 and clean a top surface of the wafer W by coming into contact with the top surface of the wafer W.

The housing 21 is provided with a non-illustrated transfer opening through which the wafer W is carried into/from the housing 21 by the substrate transfer device 17 (see FIG. 1). A non-illustrated shutter is provided at the transfer opening. When the carry-in/out of the wafer W is performed, the shutter is opened, whereas the shutter and the transfer opening are closed when a processing is performed.

The cup 22 receives the processing liquid supplied onto the wafer W and drains the received processing liquid through a non-illustrated drain port.

The wafer holding/rotating unit 23 is equipped with a rotation shaft 23S configured to be rotated by being connected to a motor M provided under the housing 21; and a rotation plate 23P connected to the rotation shaft 23S at a substantially central portion of a bottom surface thereof.

Further, the motor M and the rotation shaft 23S correspond to an example of a "rotation unit".

The rotation shaft 23S is provided with a conduit 23C which penetrates a central portion of the rotation shaft 23S. The conduit 23C is connected to a $N_2$ gas supply source 26 via a flow rate controller 25 such as a valve. A space is formed between the rotation plate 23P of the wafer holding/rotating unit 23 and the wafer W held by the wafer holding/rotating unit 23, and a $N_2$ gas passing through the conduit 23C flows into this space from an upper end of the conduit 23C and then flows outwards toward a periphery thereof. If the wafer holding/rotating unit 23 and the wafer W are rotated, the space between the rotation plate 23P and the wafer W becomes to have a negative pressure as compared to a space above the wafer W. As a consequence, a central portion of the wafer W is bent, and flatness of the top surface of the wafer W may be deteriorated and uniformity of the liquid processing may be degraded. Since, however, the $N_2$ gas is supplied into this space, it may be possible to suppress the bending of the central portion of the wafer W. Furthermore, since the $N_2$ gas is discharged from the space between the rotation plate 23P and the wafer W, there can be obtained an effect of suppressing the processing liquid supplied onto the top surface of the wafer W from adhering to the bottom surface of the wafer W.

Furthermore, the gas supplied from the conduit 23C may not be limited to the $N_2$ gas, and another inert gas such as an argon gas or a dry air may be used, for example. The conduit 23C, the flow rate controller 25 and the $N_2$ gas supply source 26 correspond to an example of a "gas supply unit".

The brush 24 is supported by an arm 24A which is configured to be rotated on a horizontal plane and moved up and down. Formed within the arm 24A is a conduit 24C through which the processing liquid supplied to the wafer W is flown. The conduit 24C is connected to a processing liquid supply source 28 via a flow rate controller 27 such as a valve or the like. At the same time as (or slightly before) the arm 24A is rotated and moved down and the brush 24 is brought into contact with the top surface of the wafer W, the processing liquid (for example, deionized water) from the processing liquid supply source 28 is flown through the conduit 24C and is supplied onto the top surface of the wafer W from an opening 24B formed at a base end of the brush 24. By bringing the brush 24 into contact with the top surface of the wafer W, the top surface of the wafer W is cleaned, and a particle or a residue removed by the brush 24 can be washed away by the processing liquid.

In the present exemplary embodiment, the wafer W is gripped by a plurality of grippers 23G with a pattern forming surface thereof facing downwards, and a surface of the wafer W opposite to the pattern forming surface is processed by the brush 24.

Here, though the processing unit 16 is described to be provided with the brush 24 having the above-described configuration, the processing unit 16 may be additionally equipped with a nozzle for discharging the processing liquid onto the top surface of the wafer W.

The rotation plate 23P is a circular plate-shaped member and is disposed under the wafer W. The grippers 23G (only one is shown in FIG. 2) configured to grip the wafer W from a lateral side thereof by pressing a peripheral portion of the wafer W are provided at a peripheral portion of the rotation plate 23P.

Each gripper 23G includes a lever member 23L configured to be rotated around a rotation shaft 23T; and a gripping piece 23A configured to be brought into contact with the peripheral portion of the wafer W by being rotated as the lever member 23L is rotated. Provided under each lever member 23L is an uplift plate 41 which can be brought into contact with one end of the lever member 23L. The uplift plate 41 is extended in the horizontal direction and is vertically supported from below by a plurality of supporting columns 42 arranged in a circle shape. The supporting columns 42 are supported from below by an arm member 43 which is extended in the horizontal direction. The arm member 43 is configured to be moved up and down by an elevating device 44.

Further, provided at the peripheral portion of the rotation plate 23P is a plurality of lift pins 23H (only one is shown in FIG. 2) configured to hold the peripheral portion of the wafer W from below and move the wafer W up and down when the wafer W is transferred from/to the substrate transfer device 17 (see FIG. 1). The lift pins 23H are vertically extended and supported by an arm member 51 extended in the horizontal direction. The arm member 51 is configured to be moved up and down by an elevating device 52.

Figure 3:
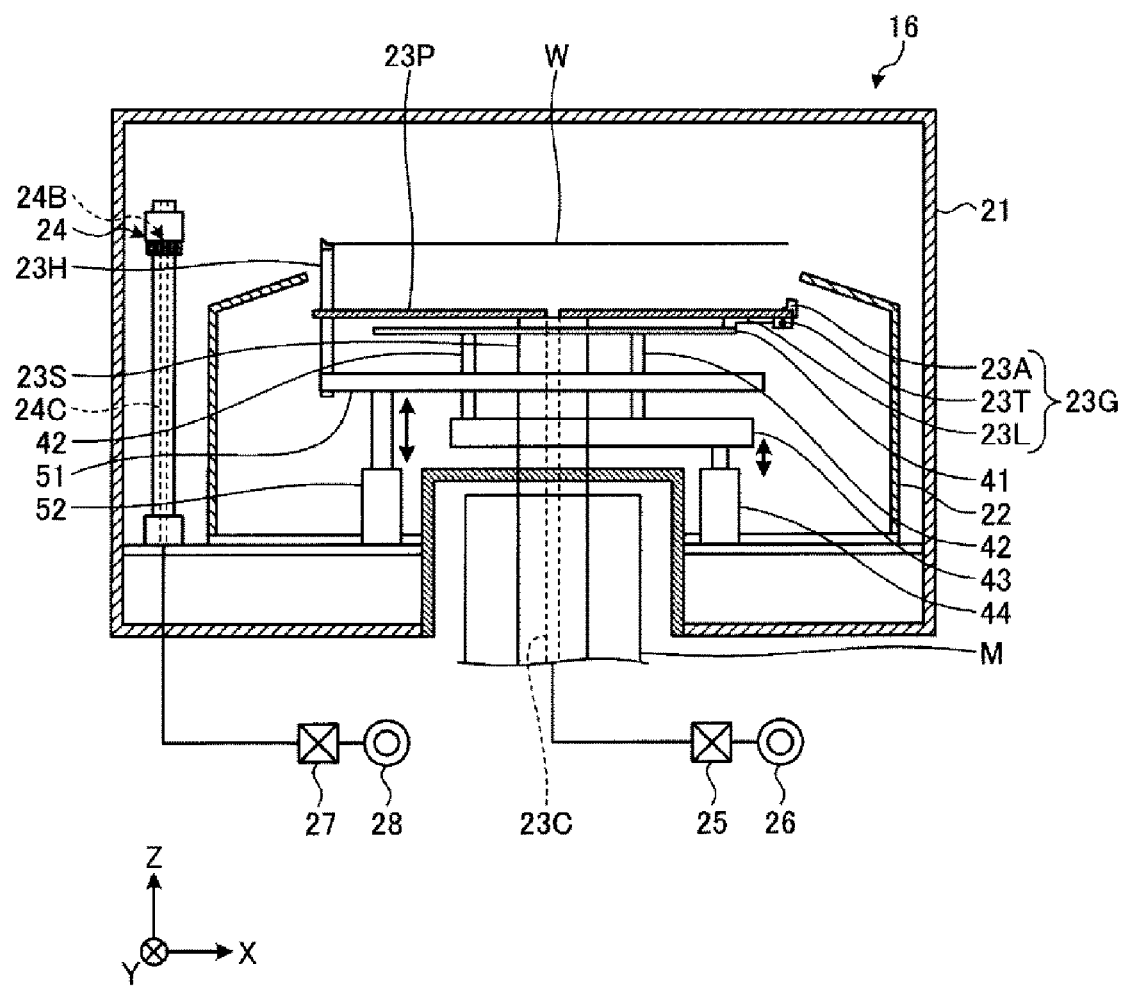
FIG. 3 is a diagram for describing an operation of grippers and lift pins.

Here, operations of the grippers 23G and the lift pins 23H will be explained with reference to FIG. 3. FIG. 3 is a diagram for describing the operations of the gripper 23G and the lift pin 23H.

As depicted in FIG. 3, when the wafer W is carried in, the uplift plate 41 is moved upwards by the elevating device 44 and pushes the one end of the lever member 23L of the gripper 23G upwards. As a result, the gripping piece 23A provided at the other end of the lever member 23L is inclined outwards. Further, when the wafer W is carried in, the lift pin 23H is moved upwards by the elevating device 52 and is located at a position higher than the rotation plate 23P.

The wafer W carried into the housing 21 is delivered onto the lift pin 23H from the substrate transfer device 17. Then, if the lift pin 23H is lowered to a preset position, the uplift plate 41 is also lowered. Accordingly, a contact state between the uplift plate 41 and the lever member 23L is released, and the lever member 23L is rotated around the rotation shaft 23T, so that the gripping piece 23A is pressed against the peripheral portion of the wafer W. As the gripping pieces 23A of the grippers 23G press the peripheral portion of the wafer W, the wafer W is gripped. In this state, if the motor M is rotated, the rotation plate 23P and the grippers 23G provided thereto are rotated, and the wafer W held by the grippers 23G on the rotation plate 23P is also rotated.

Configuration of Rotation Plate

Figure 4:
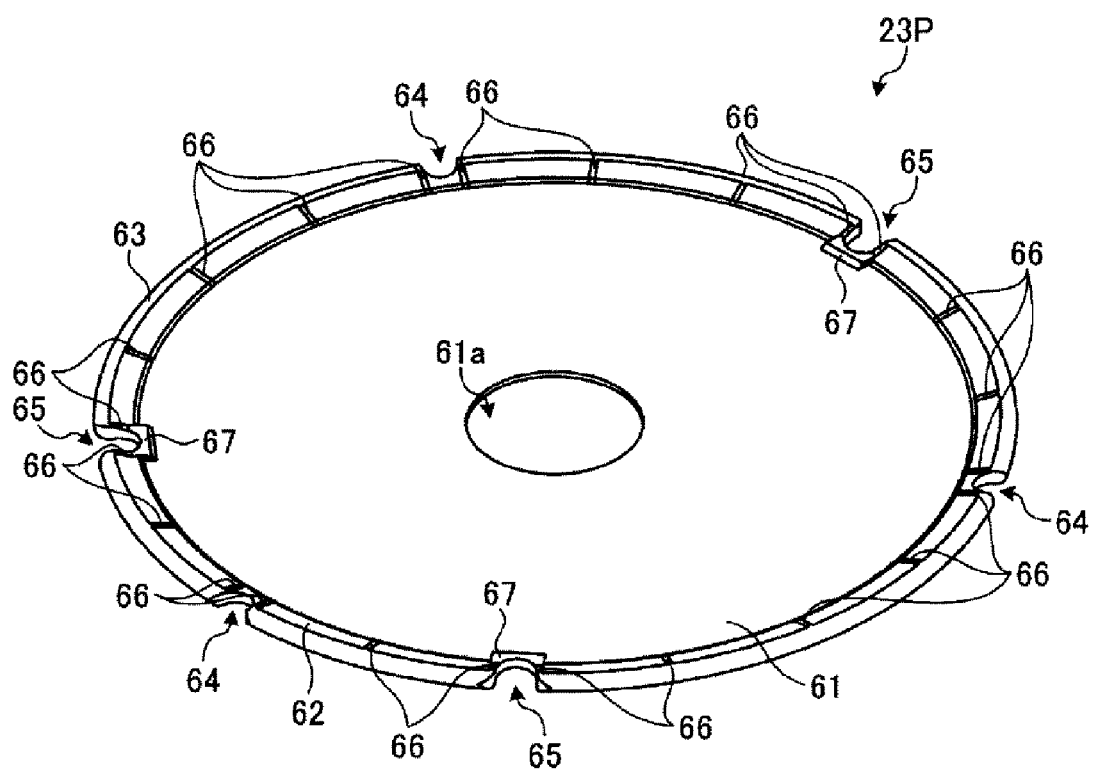
FIG. 4 is a perspective view of a rotation plate.

Now, a configuration of the rotation plate 23P will be explained with reference to FIG. 4 and FIG. 5. FIG. 4 is a perspective view of the rotation plate 23P, and FIG. 5 is a plan view of the rotation plate 23P.

Figure 5:
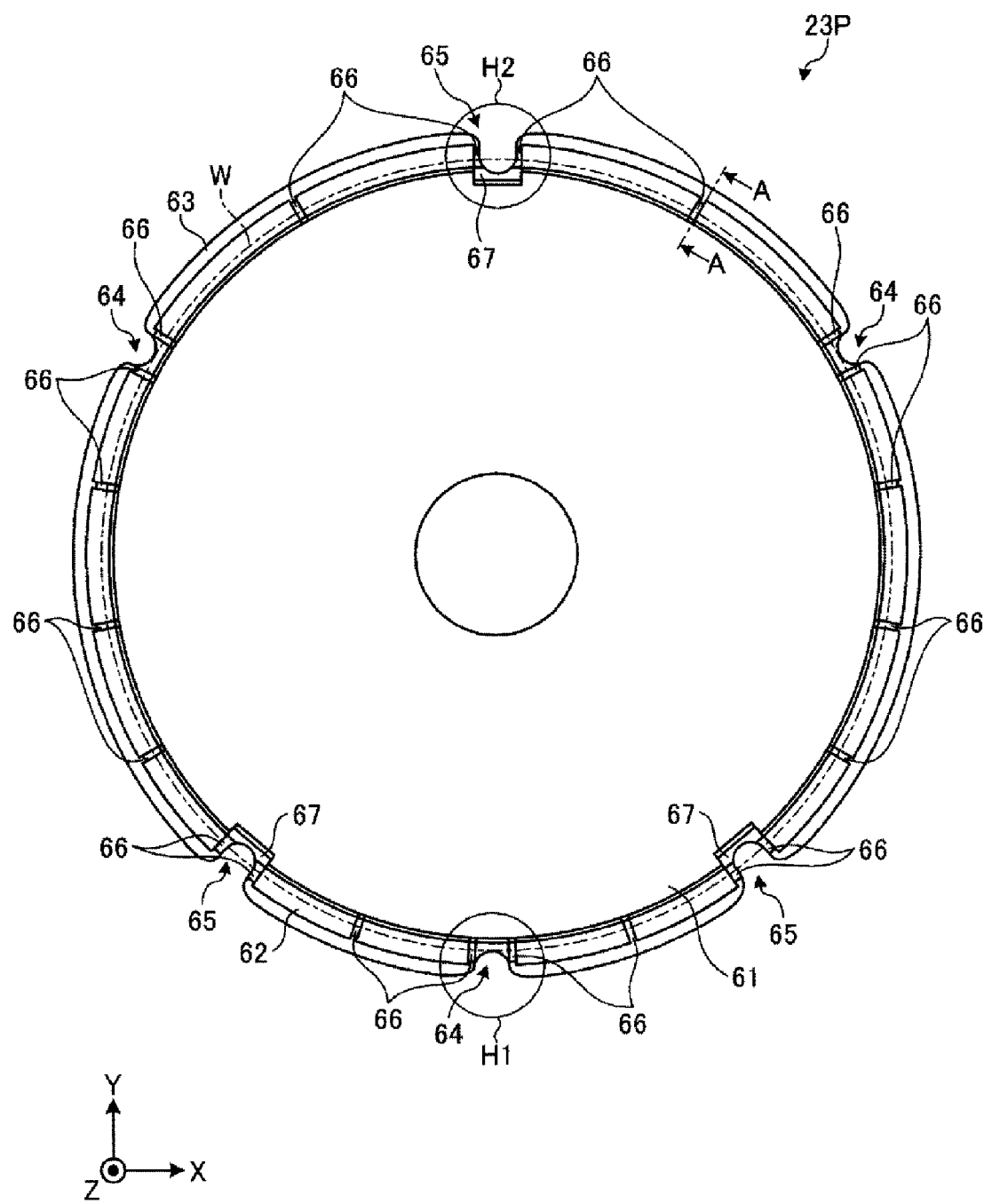
FIG. 5 is a plan view of the rotation plate.

As shown in FIG. 4 and FIG. 5, the rotation plate 23P includes a first flat portion 61, an inclined portion 62 and a second flat portion 63.

The first flat portion 61 has a circular plate shape having a smaller diameter than the wafer W. An opening 61A for supplying a $N_2$ gas toward the bottom surface of the wafer W is provided at a central portion of the first flat portion 61.

The inclined portion 62 is provided to be adjoined to an outer periphery of the first flat portion 61. The inclined portion 62 has a diameter larger than the wafer W and has an inclined surface which is inclined downwards from the outer side of the wafer W (i.e., from the second flat portion 63) toward the inner side of the wafer W (i.e., toward the first flat portion 61). This inclined surface is extended in a circumferential direction of the wafer W. To elaborate, the inclined surface of the inclined portion 62 is provided along the entire circumference of the outer periphery of the first flat portion 61. The second flat portion 63 has a flat surface adjoined to an outer periphery of the inclined portion 62.

Further, the rotation plate 23P also has a plurality of first notch portions 64, a plurality of second notch portions 65, a plurality of supporting members 66 and a plurality of raising portions 67.

The first notch portions 64 are formed by notching portions of the outer periphery of the rotation plate 23P respectively corresponding to the gripping pieces 23A inwardly in the diametrical direction. Each first notch portion 64 reaches a midway position of the inclined surface of the inclined portion 62. The gripping pieces 23A of the grippers 23G are placed in these first notch portions 64, respectively.

The second notch portions 65 are formed by notching portions of the outer periphery of the rotation plate 23P respectively corresponding to the lift pins 23H inwardly in the diametrical direction. The second notch portion 65 is larger than the first notch portion 64, and reaches a bottom portion of the inclined surface of the inclined portion 62. The lift pins 23H are moved up and down through these second notch portions 65, respectively.

In the exemplary embodiment, three first notch portions 64 and three second notch portions 65 are alternately arranged at a preset distance along the outer peripheral portion of the rotation plate 23P. However, the number and the arrangement of the first and second notch portions 64 and 65 are not limited to the aforementioned example.

The supporting members 66 are protruded from the inclined surface of the inclined portion 62 and support the peripheral portion of the wafer W from below. Each of these supporting members 66 has a long narrow shape extended from the outer side of the wafer W toward the inner side thereof, specifically, in the diametrical direction of the first flat portion 61 (that is, the wafer W).

Figure 6:
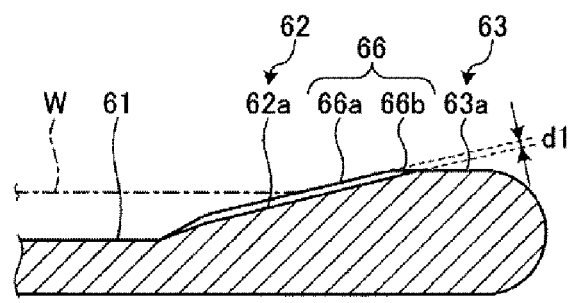
FIG. 6 is a cross sectional view taken along a line A-A of FIG. 5.

Here, a configuration of the supporting member 66 will be elaborated with reference to FIG. 6. FIG. 6 is a cross sectional view taken along a line A-A of FIG. 5.

As illustrated in FIG. 6, the supporting member 66 has an inclined surface 66a inclined at the same angle as the inclined surface 62a of the inclined portion 62. The supporting member 66 supports the wafer W on this inclined surface 66a. A protrusion height d1 of the inclined surface 66a of the supporting member 66 from the inclined surface 62a of the inclined portion 62 is set to be a height at which entrance of the particle from the top surface side of the wafer W is suppressed while the processing liquid flown to the bottom surface of the wafer W is appropriately discharged out. For example, when the height from the bottom surface (top surface of the first flat portion 61) of the rotation plate 23P to a flat surface 63a is 5 mm, the protrusion height d1 is set to be about 0.3 mm.

Further, the supporting member 66 has a flat surface 66b continuously connected to the inclined surface 66a and the flat surface 63a of the second flat portion 63. The flat surface 66b is provided at the same height as the flat surface 63a of the second flat portion 63.

Figure 7:
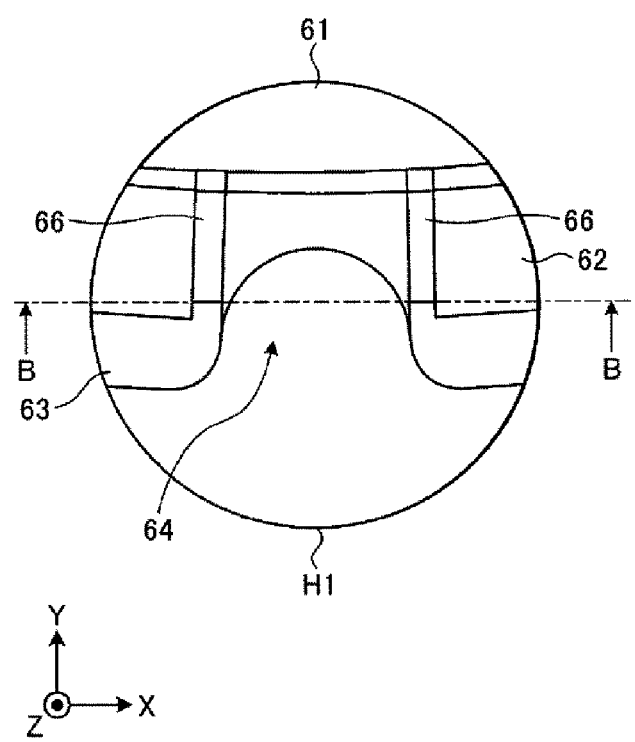
FIG. 7 is an enlarged view of a portion H1 in FIG. 5.
Figure 8:
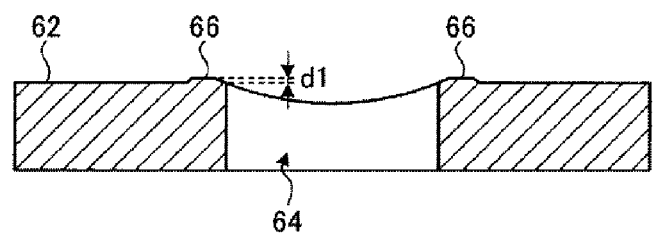
FIG. 8 is a cross sectional view taken along a line B-B of FIG. 7.

FIG. 7 is an enlarged view of a portion H1 of FIG. 5. FIG. 8 is a cross sectional view taken along a line B-B of FIG. 7. As shown in FIG. 7 and FIG. 8, two of the supporting members 66 are arranged adjacent to both sides of the first notch portion 64 in the circumferential direction.

Figure 9:
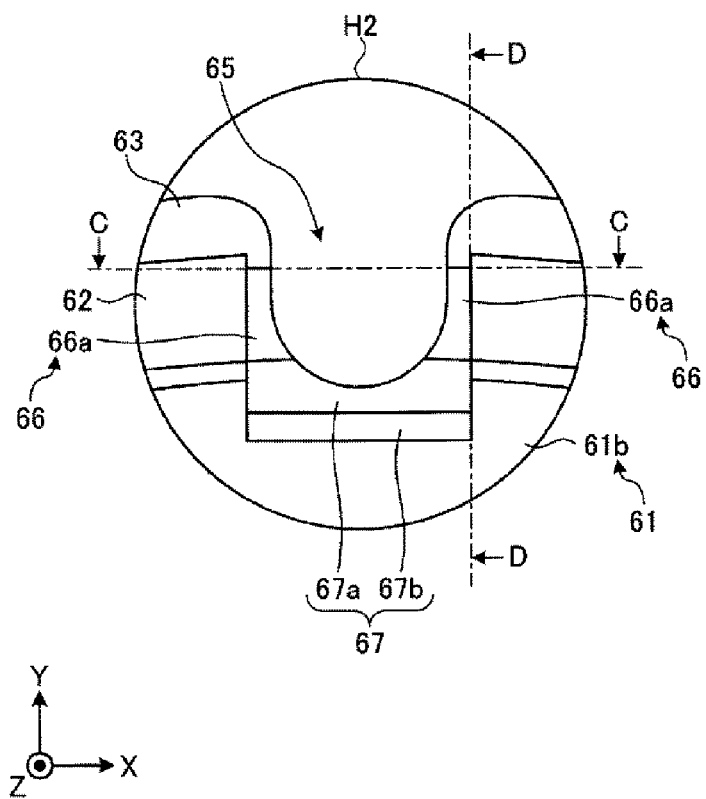
FIG. 9 is an enlarged view of a portion H2 in FIG. 5.

FIG. 9 is an enlarged view of a portion H2 of FIG. 5. Further, FIG. 10 is a cross sectional view taken along a line C-C of FIG. 9, and FIG. 11 is a cross sectional view taken along a line D-D of FIG. 9.

Figure 10:
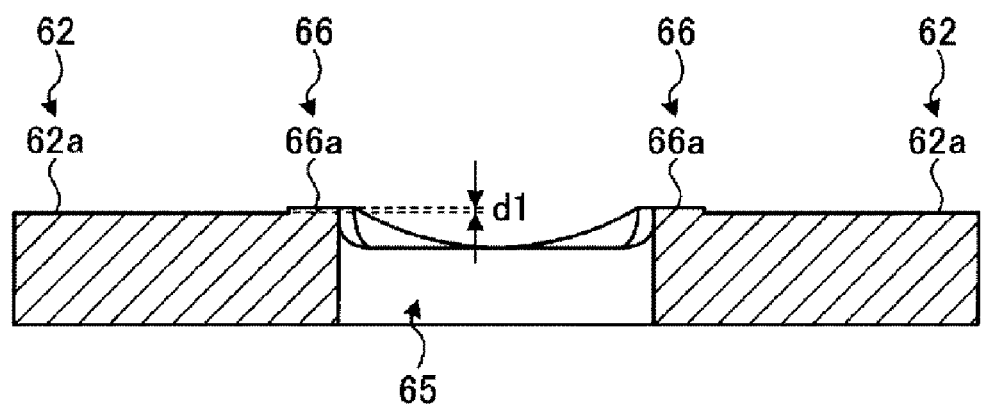
FIG. 10 is a cross sectional view taken along a line C-C of FIG. 9.

As shown in FIG. 9 and FIG. 10, two of the supporting members 66 are arranged adjacent to both sides of the second notch portion 65 in the circumferential direction.

Figure 11:
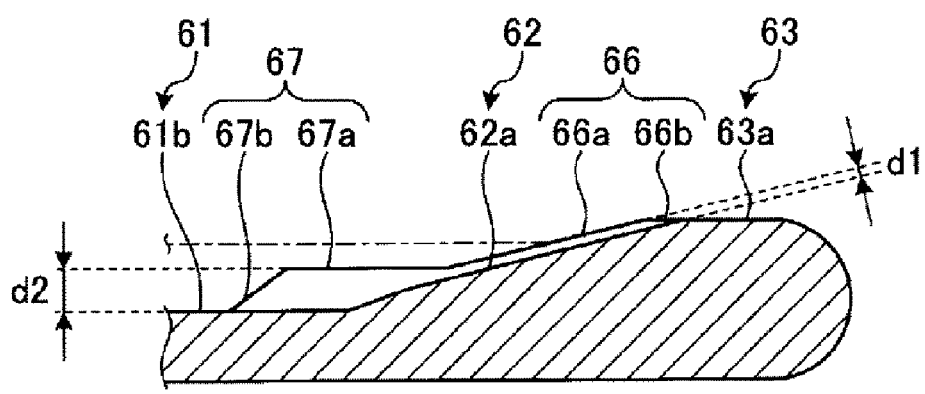
FIG. 11 is a cross sectional view taken along a line D-D of FIG. 9.

Furthermore, as depicted in FIG. 9 and FIG. 11, the raising portion 67 extending parts of the inclined surface 62a of the inclined portion 62 and the flat surface 61b of the first flat portion 61 is provided at an inner position of the rotation plate 23P than the second notch portion 65 in the diametrical direction.

The raising portion 67 is adjoined to the second notch portion 65 and the two supporting members 66 provided at both sides of the second notch portion 65. To elaborate, the raising portion 67 has a flat surface 67a adjoined to the inclined surfaces 66a of the two supporting members 66 provided at both sides of the second notch portion 65; and an inclined surface 67b adjoined to the flat surface 67a and the flat surface 61b of the first flat portion 61.

A protrusion height d2 of the flat surface 67a of the raising portion 67 from the flat surface 61b of the first flat portion 61 is set to be a height at which the flat surface 67a is not in contact with the bottom surface of the wafer W. To elaborate, an outer periphery of the flat surface 67a of the raising portion 67 is located inner side than the outer periphery of the wafer W in the diametrical direction, and the wafer W is supported on the inclined surface 66a of the supporting member 66 at a position higher than the flat surface 67a of the raising portion 67.

Function of Supporting Member

Figure 12:
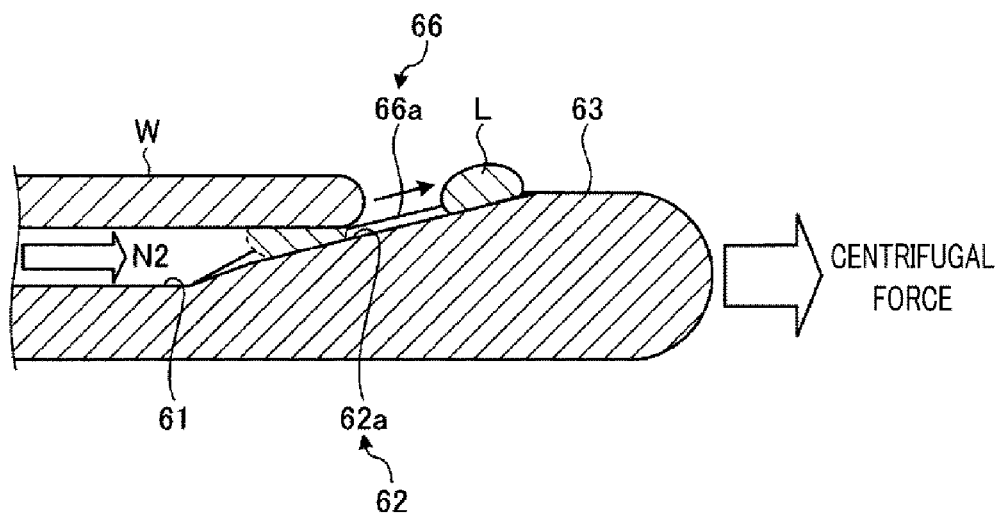
FIG. 12 is an enlarged schematic cross sectional view illustrating a contact portion of the rotation plate with a wafer according to the exemplary embodiment.

Now, a function of the aforementioned supporting member 66 will be explained. FIG. 12 is an enlarged schematic cross sectional view illustrating a contact portion between the wafer W and the rotation plate 23P according to the present exemplary embodiment.

Assume that the wafer W is brought into contact with and directly supported by the inclined surface 62a of the inclined portion 62, and a path from the top surface side of the wafer W to the bottom surface side thereof is blocked by the inclined surface. With this configuration, it is possible to obtain an effect suppressing the entrance of a processing liquid L toward the bottom surface side of the wafer W. If the wafer W is bent, however, the processing liquid may flow toward the bottom surface side of the wafer W through a minute gap which is formed between the wafer W and the inclined surface.

After processing the wafer W with the processing liquid, the processing unit performs a drying process of removing the processing liquid remaining on the wafer W by a centrifugal force caused by rotating the wafer W at a high speed. The processing liquid flown to the bottom surface side of the wafer W is difficult to remove from the minute gap which is formed as the wafer W is bent, and is highly likely to remain at the bottom surface side of the wafer W. Accordingly, in the conventional liquid processing apparatus, the liquid residue may be left at the peripheral portion of the bottom surface of the processed wafer W.

In contrast, in the processing unit 16 according to the present exemplary embodiment, the wafer W is supported on the inclined surface 66a which is protruded from the inclined surface 62a of the inclined portion 62, as illustrated in FIG. 12. Accordingly, since a preset minute gap is provided between the wafer W and the inclined surface 62a, it is possible to discharge out the processing liquid L flown to the bottom surface side of the wafer W toward the outside of the wafer W through the minute gap efficiently by the combination of the $N_2$ gas and the centrifugal force generated by the rotation of the wafer W while suppressing the inflow of the processing liquid L toward the bottom surface side of the wafer W to some extent with the inclined portion 62.

Furthermore, since the supporting member 66 according to the exemplary embodiment has the long narrow shape extended from the outer side of the wafer W toward the inner side thereof, the supporting member 66 supports, when viewed locally, the curved surface of the peripheral portion of the bottom surface of the wafer W in a point-contact manner by the long narrow flat surface. Thus, even in case that the pattern forming surface of the wafer W faces downwards as in the present exemplary embodiment, the wafer W can be accurately placed on the supporting member 66 such that the peripheral portion of the bottom surface of the wafer W where no pattern is formed is brought into contact with the supporting member 66. Therefore, with this simple configuration, it is possible to suppress a problem such as, for example, the interference between the pattern forming surface and the supporting member 66.

Thus, in the processing unit 16 according to the present exemplary embodiment, it is possible to reduce the liquid residue on the bottom surface of the wafer W while placing the wafer W accurately.

Furthermore, if the supporting member 66 is just simply provided, the minute gap between the supporting member 66 and the wafer W may be increased more than required in the vicinity of the first notch portion 64 and the second notch portion 65. In this case, in the vicinity of the first notch portion 64 and the second notch portion 65, a flow velocity of the $N_2$ gas supplied to the bottom surface of the wafer W from the conduit 23C (see FIG. 2) becomes lower than that of the $N_2$ gas in the other portions, so that particles may easily enter from the vicinity of the first notch portion 64 and the second notch portion 65.

To solve this problem, in the processing unit 16 according to the present exemplary embodiment, two supporting members 66 are disposed at both sides of each of the first notch portion 64 and the second notch portion 65 in the circumferential direction. With this configuration, a decrease of the flow velocity of the $N_2$ gas in the vicinity of the first notch portion 64 and the second notch portion 65 is suppressed, so that the entrance of the particle from the vicinity of the first notch portion 64 and the second notch portion 65 can be suppressed.

Furthermore, since the second notch portion 65 is formed to be larger than the first notch portion 64, the decrease of the flow velocity of the $N_2$ gas in the vicinity of the second notch portion 65 may be larger than that of the flow velocity of the $N_2$ gas in the vicinity of the first notch portion 64. In consideration of this problem, in the processing unit 16 according to the present exemplary embodiment, a portion located at the inner side of the second notch portion 65 in the diametrical direction is extended by the raising portion 67. Accordingly, the minute gap between the wafer W and the portion located at the inner side of the second notch portion 65 in the diametrical direction is reduced, so that the decrease of the flow velocity of the $N_2$ gas in the vicinity of the second notch portion 65 can be further suppressed.

Modification Examples

Now, modification examples of the processing unit 16 according to the exemplary embodiment will be explained.

Figure 13:
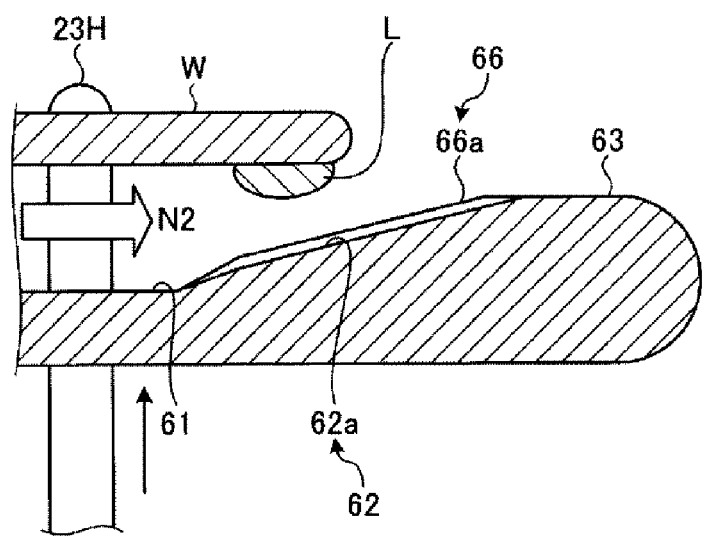
FIG. 13 is a diagram illustrating an operation example of a drying accelerating process according to a first modification example.

First, a first modification example will be discussed with reference to FIG. 13. FIG. 13 is a diagram illustrating an operation example of a drying accelerating process according to the first modification example.

As depicted in FIG. 13, the processing unit 16 may accelerate the drying of the processing liquid remaining on the bottom surface of the wafer W by supplying the $N_2$ gas to the bottom surface of the wafer W in the state that the wafer W is spaced apart from the supporting member 66 by using the lift pins 23H.

To elaborate, after the wafer W is processed by using the brush 24 (an example of a processing liquid supply unit), the control unit 18 (see FIG. 1) removes the processing liquid remaining on the top surface of the wafer W by rotating the wafer W at a high speed. Then, after stopping the rotating of the wafer W, the control unit 18 spaces the wafer W apart from the supporting members 66 by using the lift pins 23H. In this state, the control unit 18 supplies the $N_2$ gas to the bottom surface of the wafer W from the conduit 23C (see FIG. 2).

With this operation, it is possible to remove the processing liquid remaining on the bottom surface of the wafer W more efficiently. Accordingly, the liquid residue remaining on the bottom surface of the wafer W can be further reduced.

Further, the control unit 18 includes various types of circuits and a microcomputer having a CPU (Central Processing Unit), a ROM (Read Only Memory), a RAM (Random Access Memory), an input/output port, and so forth. The CPU of the microcomputer implements a control to be described later by reading out and executing a program stored in the ROM. Further, the storage unit 19 is implemented by, but not limited to, a semiconductor memory device such as a RAM or a flash memory, or a storage device such as a hard disk or an optical disk.

Figure 14:
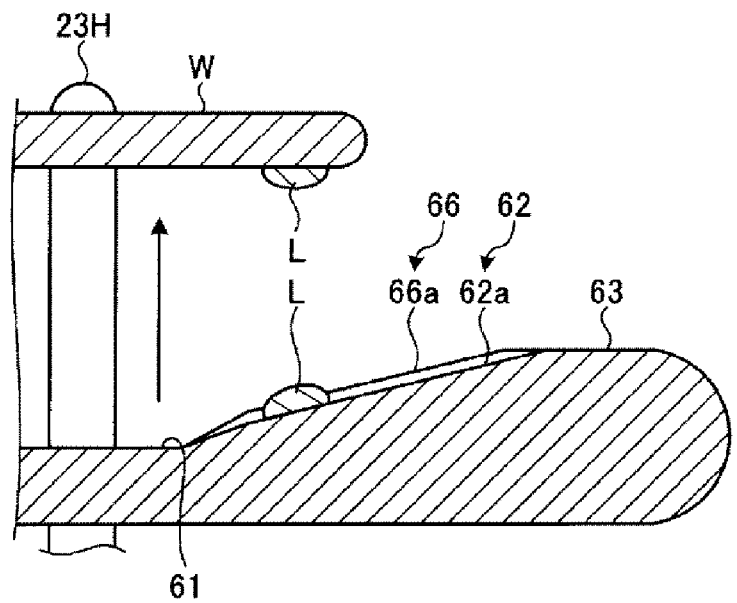
FIG. 14 is a diagram illustrating an operation example of a drying accelerating process according to a second modification example.
Figure 15:
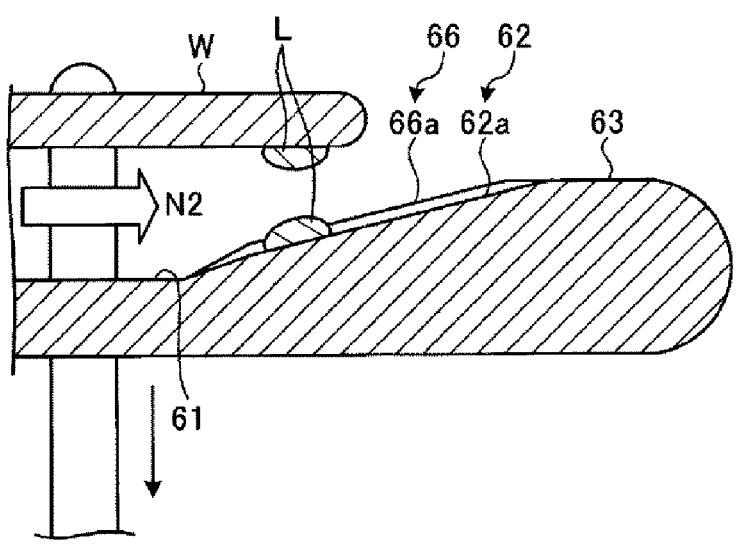
FIG. 15 is a diagram illustrating an operation example of the drying accelerating process according to the second modification example.

Now, a second modification example will be described with reference to FIG. 14 and FIG. 15. FIG. 14 and FIG. 15 are diagrams illustrating an operation example of a drying accelerating process according to the second modification example.

As shown in FIG. 14, when raising the lift pin 23H in the aforementioned drying accelerating process, the control unit 18 may move up the lift pin 23H at a speed higher than a speed where the lift pin 23H is moved up when transferring the wafer W from/to the substrate transfer device 17. By moving up the lift pin 23H at such a high speed, the processing liquid L flown to the bottom surface side of the wafer W is split into a processing liquid L remaining on the bottom surface of the wafer W and a processing liquid L remaining on the inclined surface 62a of the inclined portion 62 or the inclined surface 66a of the supporting member 66. Thus, as compared to a case of moving up the lift pin 23H at a normal speed, the amount of the processing liquid L remaining on the bottom surface of the wafer W can be reduced.

Thereafter, the control unit 18 brings the wafer W closer to the supporting member 66 by lowering the lift pin 23H, and supplies the $N_2$ gas to the bottom surface of the wafer W from the conduit 23C (see FIG. 2). In this way, the minute gap between the wafer W and the inclined portion 62 is narrowed by lowering the lift pin 23H, so that the decrease of the flow velocity of the $N_2$ gas can be reduced as compared to the case where the $N_2$ gas is supplied in the state shown in FIG. 14. Therefore, the processing liquid L can be efficiently removed from the bottom surface of the wafer W.

Figure 16:
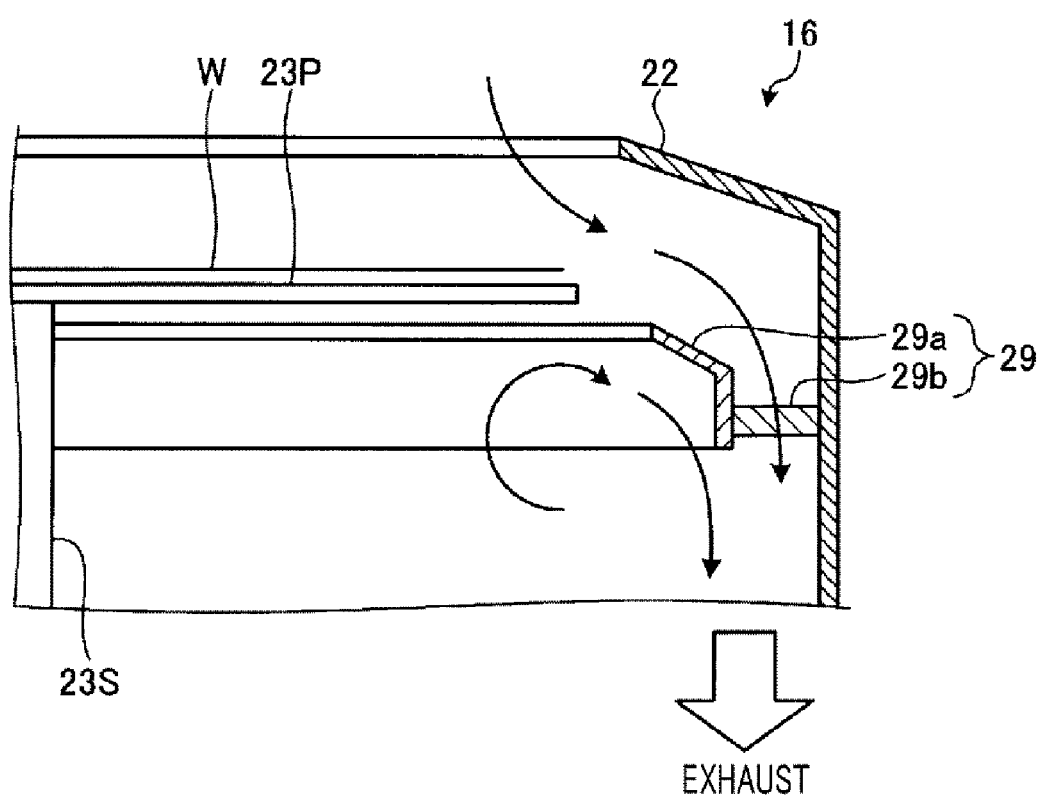
FIG. 16 is a diagram illustrating a configuration of a rectifying plate according to a third modification example.

Now, a third modification example will be explained with reference to FIG. 16. FIG. 16 is a diagram illustrating a configuration of a rectifying plate according to the third modification example. In FIG. 16, to facilitate clear understanding, the gripper 23G, the uplift plate 41, and so forth are appropriately omitted.

As illustrated in FIG. 16, the processing unit 16 may be further equipped with a rectifying plate 29. The rectifying plate 29 is provided under the rotation plate 23P within the cup 22. The rectifying plate 29 includes a surrounding wall portion 29a provided between the rotation plate 23P and the cup 22; and a fixture portion 29b which fixes the surrounding wall portion 29a to the cup 22. The surrounding wall portion 29a conforms to the inner wall of the cup 22.

By providing this rectifying plate 29, an air flow from the outside of the cup 22 toward the inside thereof can be suppressed from being disturbed (swept) within the cup 22. Therefore, the exhaust of the inside of the housing 21 can be performed efficiently.

Figure 17:
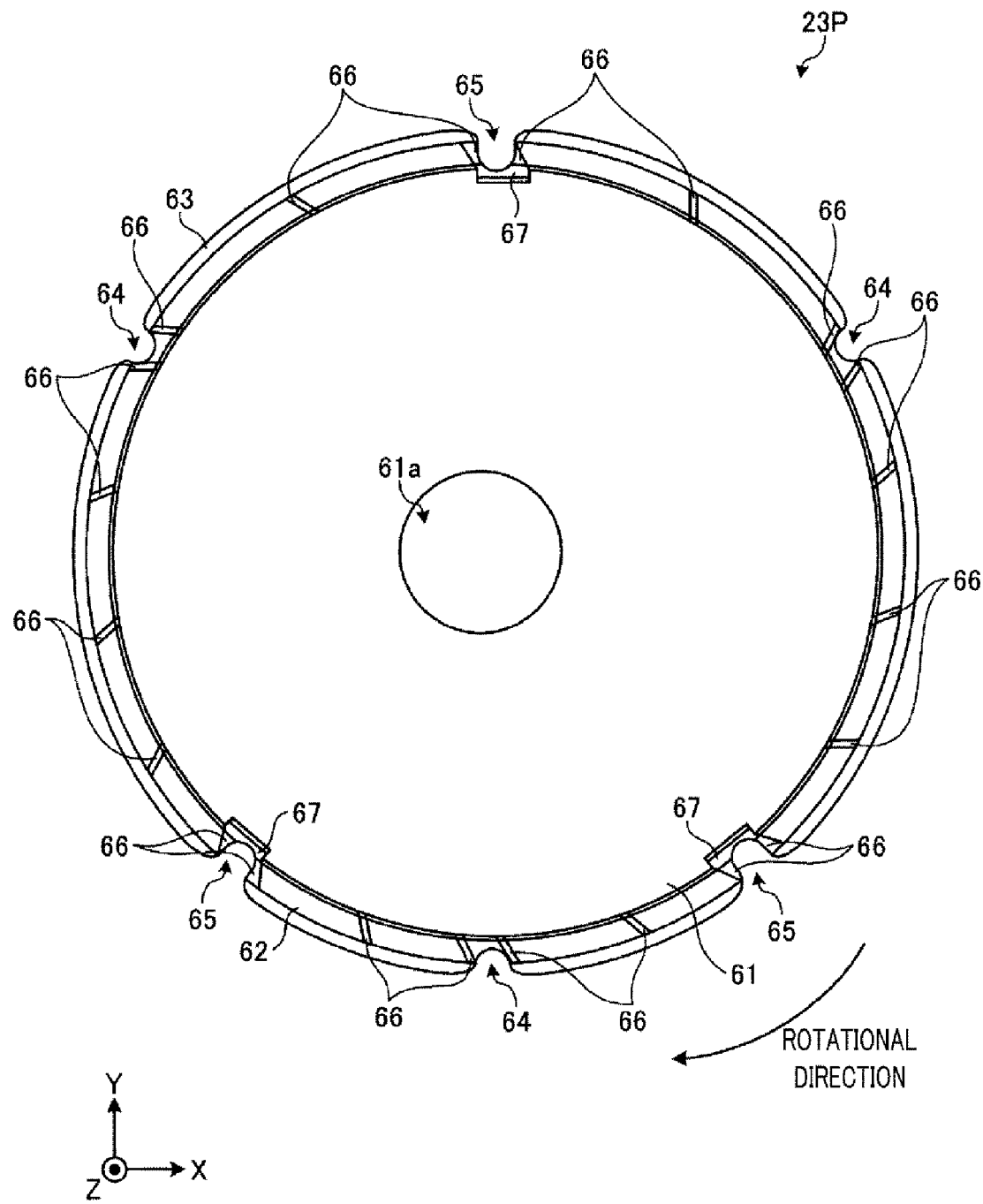
FIG. 17 is a diagram illustrating a configuration of supporting members according to a fourth modification example.

Now, a fourth modification example will be described with reference to FIG. 17. FIG. 17 is a diagram illustrating a configuration of the supporting member 66 according to the fourth modification example.

The above-described exemplary embodiment has been provided for the example case where the supporting members 66 are extended along the diametrical direction of the wafer W (that is, the first flat portion 61). As shown in FIG. 17, however, each supporting member 66 may have a shape where an end portion of the supporting member 66 at an outer side in the diametrical direction (that is, an end portion at the side of the second flat portion 63) is moved backwards in a rotational direction of the wafer W with respect to an end portion of the supporting member 66 at an inner side in the diametrical direction (that is, an end portion at the side of the first flat portion 61). With this configuration, the processing liquid flown to the bottom surface side of the wafer W can be efficiently drained out along a side surface of the supporting member 66.

As stated above, the liquid processing apparatus according to the exemplary embodiment is equipped with the inclined portion, the supporting members, the processing liquid supply unit and the rotation unit. The inclined portion is disposed under the substrate, and has the inclined surface which is inclined downwards from the outer side of the substrate toward the inner side thereof and is extended along the circumferential direction of the substrate. The supporting members are protruded from the inclined surface and support the substrate from below. The processing liquid supply unit supplies the processing liquid to the top surface of the substrate which is supported by the supporting members. The rotation unit rotates the inclined portion. Further, each of the supporting members has the long narrow shape extended from the outer side of the substrate toward the inner side thereof.

Therefore, in the processing unit 16 according to the exemplary embodiment, it is possible to reduce the liquid residue on the bottom surface of the substrate while suppressing the interference with the pattern forming surface.

Moreover, in the above-described exemplary embodiment, the brush 24 having the opening 24B for discharging the processing liquid is described as an example of the processing liquid supply unit. However, the processing liquid supply unit is not be limited to the brush 24 and may be implemented by a nozzle configured to discharge the processing liquid. The processing unit 16 may not necessarily be equipped with the brush 24.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A liquid processing apparatus, comprising:
   an inclined portion, provided under a substrate, having an inclined surface which is inclined downwards from an outer side of the substrate toward an inner side thereof and is extended along a circumferential direction of the substrate;
   a plurality of supporting members protruded from the inclined surface and configured to support the substrate from below;
   a processing liquid supply unit configured to supply a processing liquid onto a top surface of the substrate supported by the supporting members;
   a rotation unit configured to rotate the inclined portion; and
   a plurality of grippers configured to grip the substrate from a lateral side of the substrate,
   wherein each of the supporting members has a long narrow shape extended from the outer side of the substrate toward the inner side thereof,
   the inclined portion comprises a plurality of first notch portions provided by notching portions of an outer periphery of the inclined surface respectively corresponding to the grippers, and
   two of the supporting members are disposed at both sides of each of the first notch portions.

2. The liquid processing apparatus of claim 1, wherein each of the supporting members extends from an outer diameter of the substrate towards an inner diameter of the substrate.

3. The liquid processing apparatus of claim 1, wherein each of the supporting members extends from an outer diameter of the substrate towards an inner diameter of the substrate and is angled from a radial direction.

4. The liquid processing apparatus of claim 1, further comprising:
   a brush cleaning unit configured to clean the top surface of the substrate supported by the supporting members with a brush,
   wherein the supporting members support the substrate from below with a pattern forming surface thereof facing downwards.

5. The liquid processing apparatus of claim 1, further comprising:
   a plurality of lift pins configured to space the substrate apart from the supporting members by lifting up the substrate;
   a gas supply unit configured to supply a gas to a bottom surface of the substrate from an inner position than the inclined portion in a diametrical direction thereof; and
   a control unit configured to control the gas supply unit to supply the gas to the bottom surface of the substrate in a state that the substrate is spaced apart from the supporting members by using the lift pins after the substrate is processed by using the processing liquid supply unit.

6. The liquid processing apparatus of claim 1,
wherein the supporting members support a peripheral portion of the substrate, and each of the supporting members has an inclined surface inclined at the same angle as the inclined surface of the inclined portion.

7. The liquid processing apparatus of claim 1,
wherein the inclined portion is provided in a rotation plate,
the rotation plate has a first flat portion, and
the inclined portion is provided to be adjoined to an outer periphery of the first flat portion.

8. The liquid processing apparatus of claim 7,
wherein the rotation plate has a second flat portion, and
the second flat portion has a flat surface adjoined to an outer periphery of the inclined portion.

9. The liquid processing apparatus of claim 8,
wherein the rotation plate is connected to the rotation unit.

10. The liquid processing apparatus of claim 8,
wherein the supporting members support a peripheral portion of the substrate, and each of the supporting members has an inclined surface inclined at the same angle as the inclined surface of the inclined portion,
each of the supporting members has a flat surface adjoined to the inclined surface and the flat surface of the second flat portion, and
the flat surface of each of the supporting members is located at the same height position as the flat surface of the second flat portion.

11. A liquid processing apparatus, comprising:
an inclined portion, provided under a substrate, having an inclined surface which is inclined downwards from an outer side of the substrate toward an inner side thereof and is extended along a circumferential direction of the substrate;
a plurality of supporting members protruded from the inclined surface and configured to support the substrate from below;
a processing liquid supply unit configured to supply a processing liquid onto a top surface of the substrate supported by the supporting members;
a rotation unit configured to rotate the inclined portion; and
a plurality of lift pins configured to space the substrate apart from the supporting members by lifting up the substrate,
wherein each of the supporting members has a long narrow shape extended from the outer side of the substrate toward the inner side thereof,
the inclined portion comprises a plurality of second notch portions provided by notching portions of an outer periphery of the inclined surface respectively corresponding to the lift pins, and
two of the supporting members are disposed at both sides of each of the second notch portions.

12. The liquid processing apparatus of claim 11,
wherein the inclined portion comprises a raising portion which is adjoined to the second notch portion and the two supporting members provided at the both sides of the corresponding second notch portion, and which extends a portion located at an inner position than the corresponding second notch portion in a diametrical direction thereof.

* * * * *